United States Patent [19]

Aikens et al.

[11] 4,330,163
[45] May 18, 1982

[54] ZERO INSERTION FORCE CONNECTOR FOR LSI CIRCUIT PACKAGE

[75] Inventors: Paul W. Aikens, Mechanicsburg; Frank J. Wilding, New Cumberland, both of Pa.

[73] Assignee: E. I. Du Pont de Nemours and Company, Wilmington, Del.

[21] Appl. No.: 100,521

[22] Filed: Dec. 5, 1979

[51] Int. Cl.³ .............................................. H01R 9/09
[52] U.S. Cl. .......................... 339/17 CF; 339/75 MP
[58] Field of Search .......... 339/17 CF, 75 MP, 75 M, 339/174

[56] References Cited

U.S. PATENT DOCUMENTS

| | | | |
|---|---|---|---|
| 3,771,109 | 11/1973 | Bruckner et al. | 339/174 |
| 3,951,491 | 4/1976 | Mysiak | 339/17 CF |
| 4,023,878 | 5/1977 | Hennessey | 339/75 MP |
| 4,076,204 | 2/1978 | Kalka | 248/500 |
| 4,130,327 | 12/1978 | Spaulding | 339/17 CF |

*Primary Examiner*—Neil Abrams

[57] ABSTRACT

An electrical connector for interconnecting a large scale integrated (LSI) circuit package having a plurality of conductive interfaces with a printed circuit board or other electrical unit. The LSI circuit package can be inserted or removed from the connector absent any significant force. The connector includes a plurality of latches movable on a ramp of a dielectric housing containing a plurality of contact springs. Movement of the latch out of the ramp valley causes it to clamp onto the upper surface of the LSI and forces the lower surface of the LSI containing the conductive interfaces to electrically contact the contact springs in the housing.

11 Claims, 8 Drawing Figures

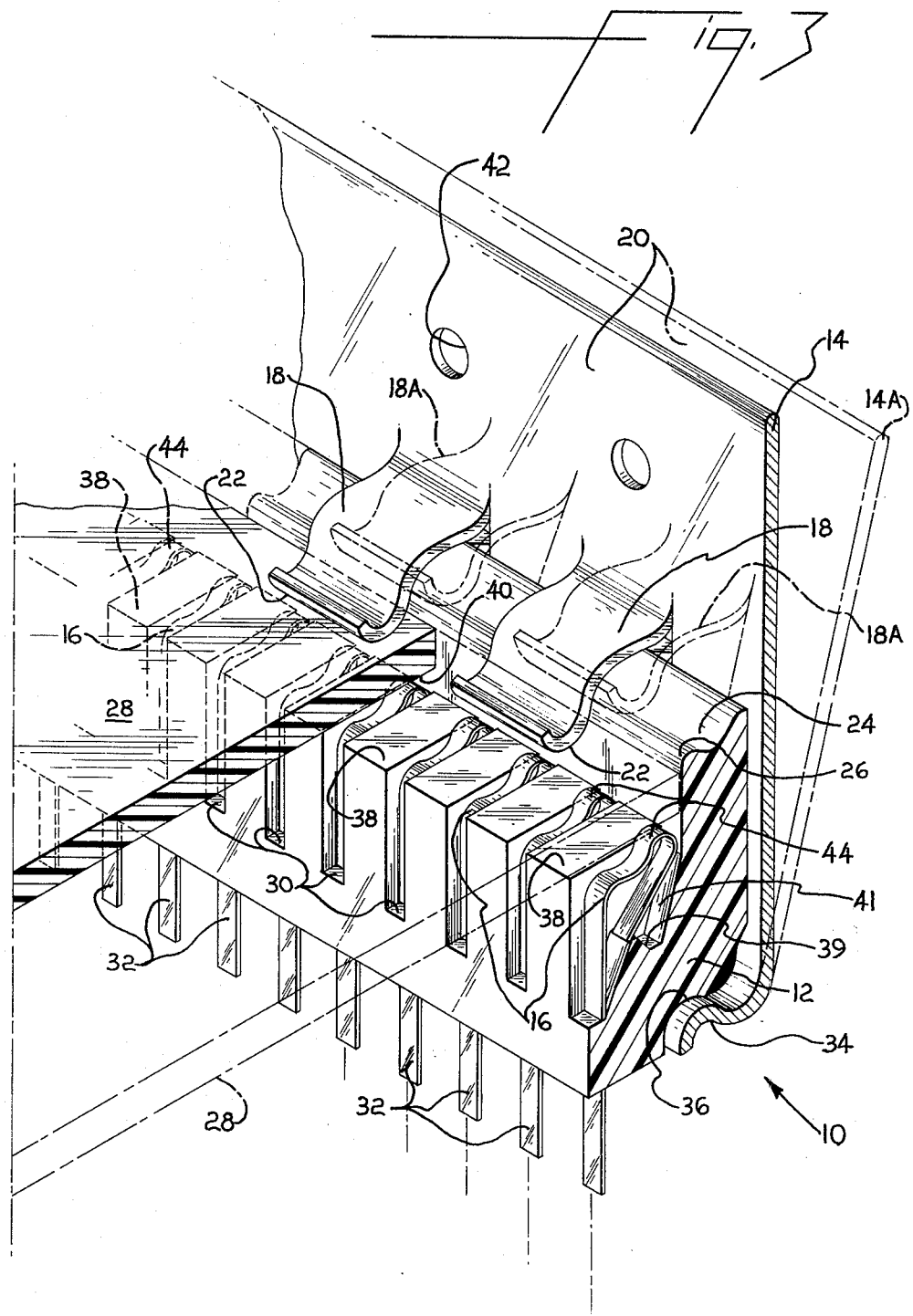

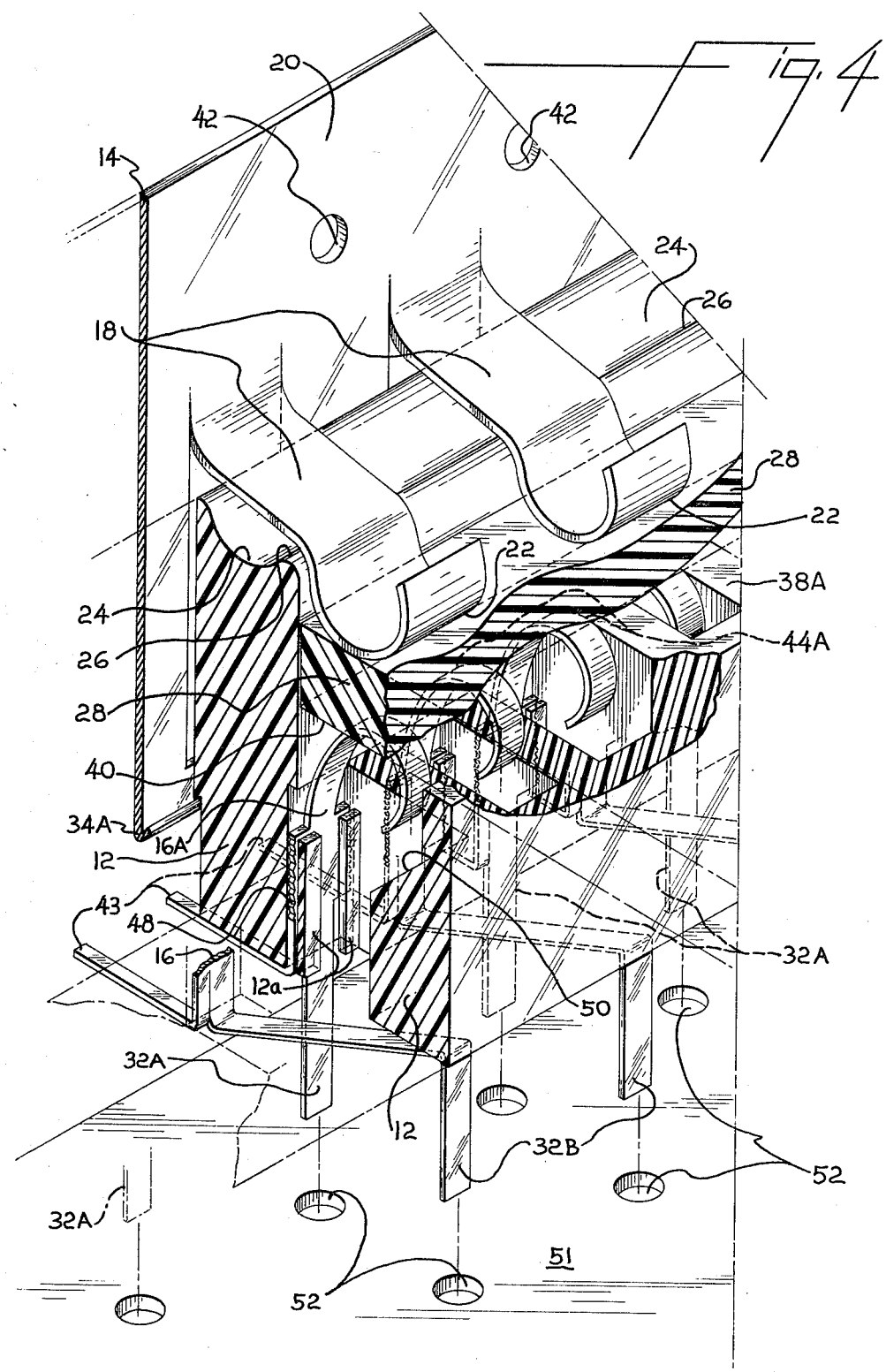

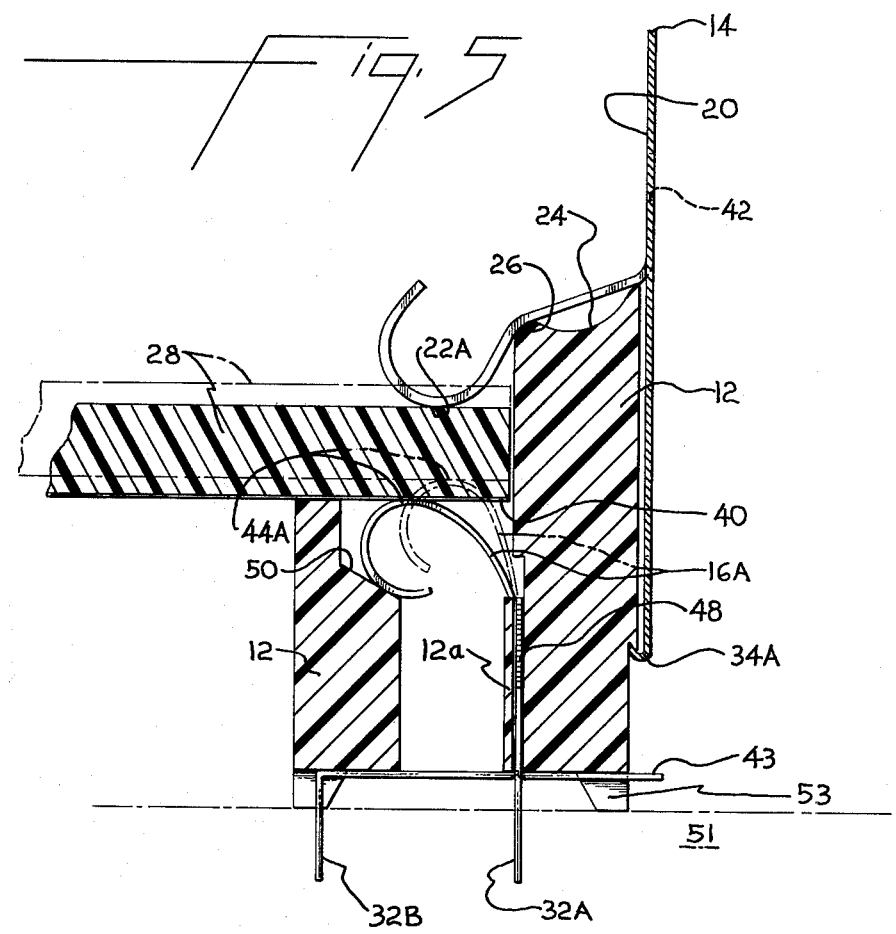
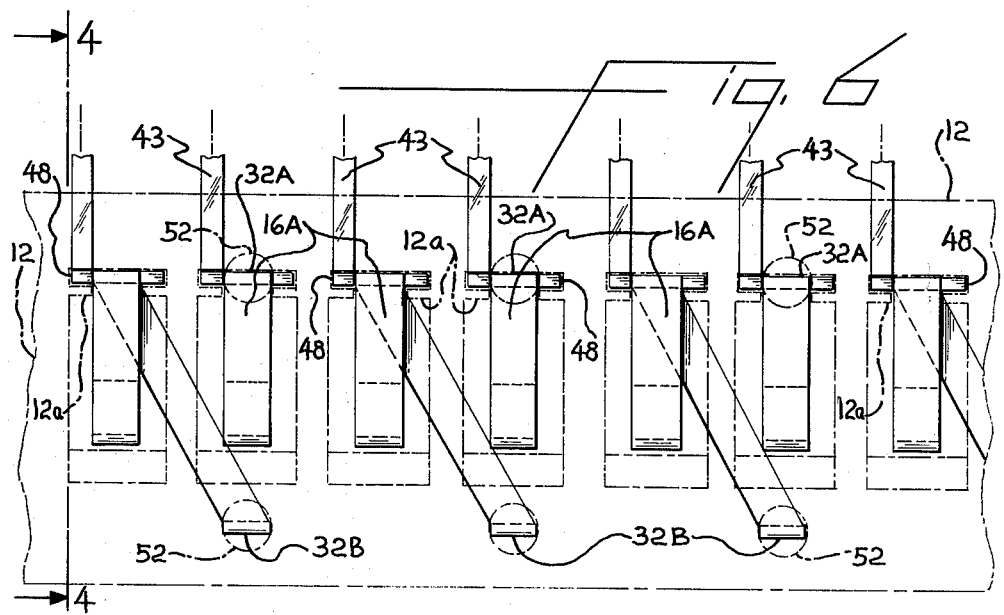

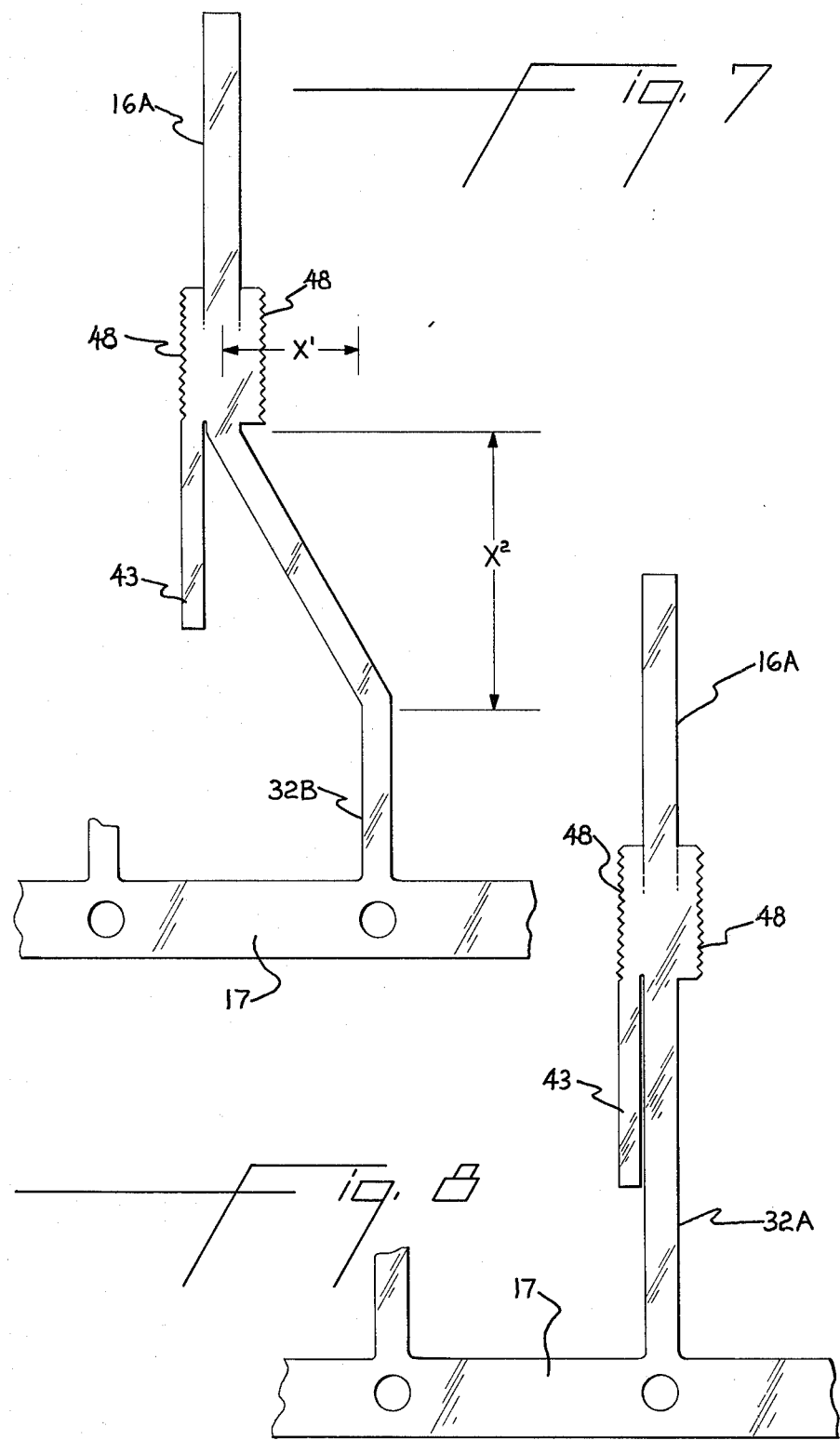

ZERO INSERTION FORCE CONNECTOR FOR LSI CIRCUIT PACKAGE

BACKGROUND OF THE INVENTION

1. Field of the Invention

This invention relates to electrical connectors. More particularly it relates to a zero insertion force connector for a large scale integrated circuit package.

2. Brief Description of the Prior Art

Leadless modular circuit packages such as large scale integrated (LSI) circuit packages are finding increasing utility in the electronics industry. It is sometimes necessary to remove LSI circuit packages from their connector in order to change programs or repair circuits. Heretofore, the removal of these packages from their connectors sometimes has caused damage to them because of the frictional forces between the conductive interfaces on the LSI contact pads and the mating contacts in the connector.

Another problem faced by the industry has been the buildup of substantial amounts of heat caused by energy flowing through the LSI circuit package and its connector. This heat, if not dissipated, can severely damage the LSI circuit package and its connector.

SUMMARY OF THE INVENTION

The present invention solves both the above problems. A latching feature of this connector allows for insertion and removal of the LSI circuit package from the connector without causing damage to the LSI circuit package from frictional forces. Furthermore, the connector of this invention provides excellent contact between a LSI circuit package and another electrical device such as a circuit board and at the same time allows for the conducting away from the connector of heat generated by the electrical flows.

The connector includes a plurality of clamping latches movable from a ramp of a dielectric housing containing a plurality of contact springs coinciding with the number of contact pads in the LSI circuit carrier. Movement of the clamping latch out of the housing valley over a ramp lip allows the clamping latch to press upon the top surface of an inserted LSI chip carrier. As the chip carrier is pressed down, it forcefully engages the spring contacts in the dielectric housing. The springs start to pivot and wipe across the corresponding carrier contact pads wiping contamination to the edge of the contact area. As the chip carrier continues to press the spring contact down, the spring butts into a plane in the housing. This causes the contact spring to back wipe to a clean contact area. Consequently, the oxides or contaminants wiped aside by the first wipe will not interfere with the electrical connection.

The latch can be made with sufficient spring tension so that the LSI circuit package is pressed by the latch flush with a housing seating ledge. Alternatively, by balancing the force of the clamping latch with a higher contact spring force, a condition can be maintained that will even prevent breakage of a warped carrier. If such a carrier is pressed against a flat mounting surface there is a risk of breakage. Using this embodiment of the invention, the chip carrier will be suspended between the contact spring and the clamping latch.

By stamping the clamping latch out of a conductive metal the electrical heat is conducted out of the connector through the latch.

BRIEF DESCRIPTION OF THE DRAWINGS

FIG. 3 is a sectioned perspective view of the connector of this invention latched onto a LSI circuit package. The phantom view of the clamping latch shows it in the open position.

FIG. 4 is a sectioned perspective view of an alternate embodiment of the connector of this invention.

FIG. 5 is an elevation in section of the connector shown in the FIG. 4 embodiment. This view shows one clamping latch and one pair of contact springs.

FIG. 6 is a diagrammatic top view of the contact springs showing their relative positions in the connector of FIG. 4.

FIG. 7 is a plan view of a stamped blank attached to a carrier strip. The blank is bendable into the inside contact spring shown in FIG. 4.

FIG. 8 is a plan view of a stamped blank attached to a carrier strip. This blank is bendable into the outside contact spring shown in FIG. 4.

DESCRIPTION OF THE PREFERRED EMBODIMENT

Figure 1:
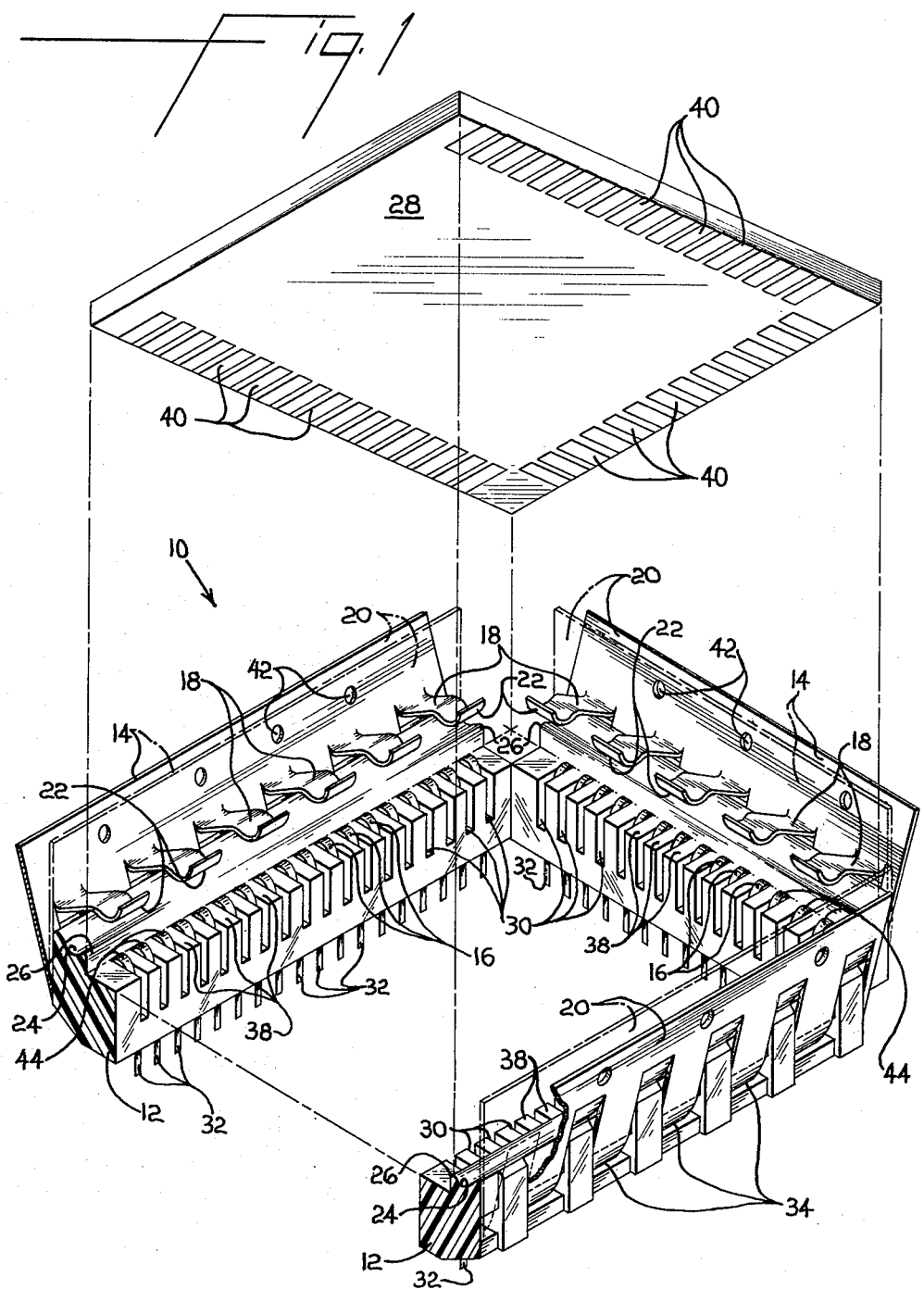
FIG. 1 is a perspective view showing three sides of an open connector with the LSI circuit package about to be inserted.

Turning first to FIG. 1, there is shown a connector 10 comprising three sections of a dielectric housing 12 and three clamping members 14. Within the body of each dielectric housing section are spring receiving grooves 30 which locate the contact springs 16. These springs have an upper contact and wiping surface 44 which engages the underside of a LSI circuit package and makes electrical contact with the contact pads 40 of the LSI chip carrier 28. The male end 32 of the spring 16 is available for engagement with a circuit board. The male end 32 may project below the housing, at right angles to the housing or may be flush with the bottom of the housing. It may be soldered to the circuit board for permanent attachment. The housing further has a valley 24 and a ramp lip 26. The valley 24 has a shape complimentary to the lower curved or convex portion 22 of the clamping latch 18. In the open position the convex portion 22 of each latch 18 is located in the valley 24.

A typical connector of this invention will have from two to four sections. Since most LSI circuit packages have four sides with contact pads on each side it is expected that in most cases the connector of this invention will have four sections forming a square.

The clamping member 14 further comprises the carrier strip 20 and pilot holes 42 stamped out of the carrier strip 20. The bottom portion of the clamping member 14 has a rib 34 which is received by a notch 36 (not shown in FIG. 1) in the dielectric housing 12. This notch acts as a pivot point for the clamping member 14.

Figure 2:
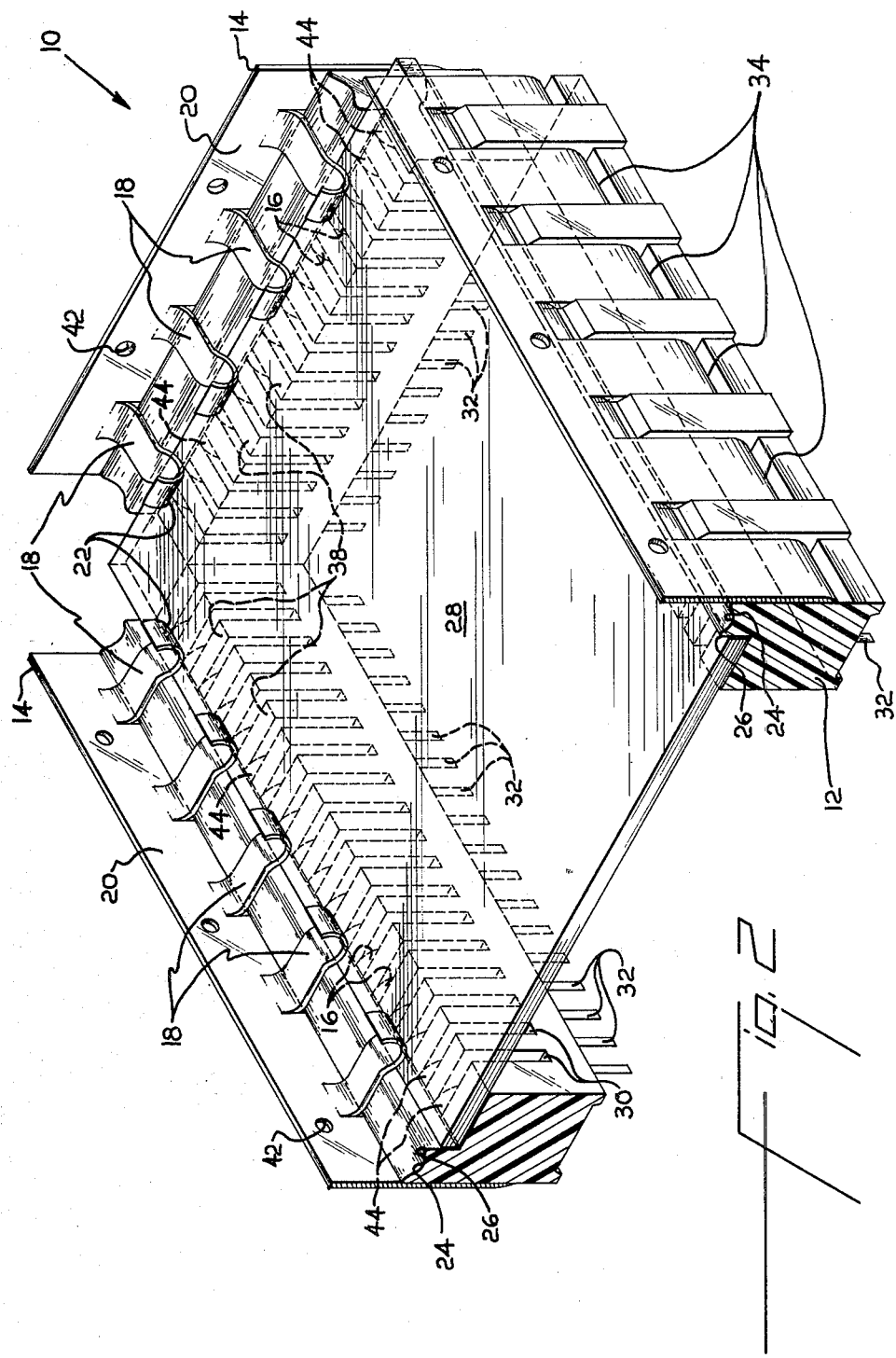
FIG. 2 is a perspective view showing three sides of a closed connector with the clamping latches in place on the upper surface of a LSI circuit package.

The LSI chip carrier 28 is lowered directly to the chip carrier seating ledge 38 of the connector 10 and is seated so that each contact pad 40 rests on a corresponding contact spring 16. If spring 16 tension is sufficient, the carrier 28 may rest on spring surface 44 without touching the seating ledge 38. The strip 20 is then pushed forward toward the LSI chip carrier 28 and the surface 22 of the clamping latch 18 moves up over the housing ramp lip 26 and snaps in on the top surface of the LSI chip carrier 28. The LSI chip carrier is now fully engaged as seen in FIG. 2 and the connector contact springs are in good electrical contact with the respective contact pads of the LSI circuit package 28.

FIG. 3 shows a portion of the connector in greater detail. Each clamping latch 18 is engaging the top surface of a LSI chip carrier 28. The phantom view shows each clamping latch 18A in the unloaded position. In the unloaded position, the clamping member 14A is not flush with the back wall of the dielectric housing 12. After the LSI chip carrier 28 is placed on the top of the seating ledge 38, the springs 16 are slightly depressed. Thereafter, as the clamping latches 18A are moved out of the valley 24 and over the lip of the ramp 26 and then on top of the LSI chip, additional pressure is placed on the springs 16. Additional pressure causes a progressive spring rate to be achieved. As the spring is deflected to a point of contact with the stop 39, further deflection will increase the contact force. This creates a backwipe. As the spring surface 44 backwipes the spring will deflect into the area 41. The movement of the wiping surface 44 of the contact spring 16 along the bottom portion of the LSI chip carrier 18 and in contact with the LSI pads 40 causes the pads to be cleaned. Each clamping member 14 pivots at its ribbed bottom point 34 in the lower receiving notch 36 of the dielectric housing 12 as the clamping member 14 is moved towards and away from the outside surface of the dielectric housing.

The clamping member 14 can be made of brass, aluminum, steel, phosphor bronze, cupro nickel or other conductive metal. It is highly desirable to have a metal which conducts heat easily. Such a clamping member will conduct heat generated by the electrical currents flowing between the LSI carrier pads and the spring contact 16 as well as heat generated by the electronic circuitry on the chip.

The spring contact 16 can be made of brass, cupro nickel, beryllium copper or phosphor bronze to facilitate good electrical contact with the contact pads 40 of the LSI chip carrier 28. The springs are stamped and bent in a conventional manner.

The dielectric housing 12 can be made of any moldable dielectric substance such as polycarbonate, or polyester.

The contact springs can be inserted into the molded housing on 20 to 250 thousandths (0.020-0.250) inch centers and are specifically centered so as to coincide with the contact pads 40 on the LSI circuit package 28. The clamping member 14 is stamped by conventional processes providing for a cutting and bending out of the clamping latch 18 and a bending of the bottom of the metal constituting the clamping member 14 so that a rib 34 can be formed. Pilot holes are used to guide the metal as it is formed.

FIGS. 4-6 depict an alternate embodiment of the invention in which the contact springs 16A are staggered so that bottom legs 32A of one row of contact springs exit from the outside portion of the dielectric housing 12 and another row of springs have their legs 32B exiting from the inside portion of their housing. Serrated edges 48 on the springs hold them within the housing under frictional forces. As the chip carrier presses against the contact springs, the springs start to pivot and wipe across the contact pads wiping off contamination. The carrier continues to press the spring contact surface as the forward radius of the spring meets a camming surface 50. See FIG. 5. This latter surface moves the spring contact in reverse direction causing a backwipe situation. Deflection of the spring increases the contact force. Balancing the spring force of the clamping latch with the higher contact spring force, a condition may be maintained that will not force a warped carrier against a flat mounting surface risking breakage but will allow the chip carrier to be suspended between the contact spring and the clamping latch without giving up wiping, backwipe or high normal force. Conversely, spring contacts can be selected which will immobilize the chip carrier 28 by pressing it firmly against ledge 38A.

The connector shown in FIG. 4 operates similarly to the connector shown in FIG. 2. Movement of the clamping member 14 towards the housing 12 moves the latch 18 out of the valley 24 and onto the upper surface of the LSI circuit package 28. The clamping member 14 pivots on the pivot rip 34A which has a different configuration from the pivot rib 34 of the FIGS. 1-3 connector.

Each spring 16A has a test contact 43 which exits through the outside portion of the housing 12. Each contact can be used to test the electrical system corresponding to the spring attached to it. The legs 32A and 32B are inserted into holes 52 in a printed circuit board 51. The legs may be soldered to the circuit board. Stand off tabs 53 hold the connector slightly above the surface of the circuit board 51.

The springs can be made of the same substances as for the springs employed in the connector of FIG. 3.

FIGS. 7 and 8 show a stamped blank attached to its carrier strip. Each blank is stamped, bent and then cut from the strip to form an inside spring (FIG. 7) or an outside spring (FIG. 8), as used in the connector shown in FIG. 4.

The interior housing 12A of the connector of FIGS. 4-6 is designed to accommodate the two rows of springs 16A.

The connectors of this invention can be used with LSI circuit packages in various electronic devices including those for automobile package assemblies, computers and electronic toys.

We claim:

1. An electrical connector adapted to receive a LSI circuit package without appreciable insertion force, said connector comprising
    a. a dielectric housing section having a plurality of cavities each adapted to receive a contact spring, said housing having an outside and an inside wall, each said contact spring having a first contact surface projecting towards the top of said housing for contact with a contact pad of a LSI circuit package and a second contact surface projecting from said housing in another direction for contact with another electrical device, the top of said housing having a shelf with a longitudinally extending valley, said valley defined by a ramp on each side, the ramp closest to the inside wall of said housing having a lip on its upper edge; and
    b. a captive clamping member movably attached to the outside wall of each said housing section, said clamping member having a rib movably attached to the outside wall of said housing section, and a latching member movable in the valley, said latching member in the retracted position being retained between the ramps in the valley and being transversely movable over the lip to clamp the LSI circuit package to the housing.

2. A connector according to claim 1 wherein the housing consists of at least two integral sections.

3. A connector according to claim 1 wherein the housing consists of at least three integral sections.

4. A connector according to claim 1 wherein the housing consists of four integral sections forming a square.

5. A connector according to claim 1 wherein the first contact surface of the spring wipes and backwipes the contact pad of a LSI circuit package upon movements of the clamping member toward said housing.

6. A connector according to claim 1 wherein the second contact surface of the spring projects below said housing.

7. A connector according to claim 6 wherein the second spring contact surface is soldered to a circuit board.

8. A connector according to claim 1 wherein the clamping member is stamped and formed from a conductive metal.

9. A connector according to claim 1 wherein the cavities are positioned on the inside wall of each said housing section.

10. A connector according to claim 1 wherein the cavities are positioned intermediate the inside and outside walls of each said housing section.

11. A connector according to claim 1 wherein each spring butts into a stop within said cavity upon moving said latching member onto the upper surface of a LSI circuit package inserted into said connector.

* * * * *